(12) United States Patent
Otremba

(10) Patent No.: US 7,508,012 B2
(45) Date of Patent: Mar. 24, 2009

(54) ELECTRONIC COMPONENT AND METHOD FOR ITS ASSEMBLY

(75) Inventor: Ralf Otremba, Kaulbeuren (DE)

(73) Assignee: Infineon Technologies AG, Munich (DE)

( * ) Notice: Subject to any disclaimer, the term of this patent is extended or adjusted under 35 U.S.C. 154(b) by 359 days.

(21) Appl. No.: 11/334,137

(22) Filed: Jan. 18, 2006

(65) Prior Publication Data

US 2007/0166877 A1    Jul. 19, 2007

(51) Int. Cl.
    *H01L 29/74*    (2006.01)
(52) U.S. Cl. .................. 257/107; 257/686; 257/666; 257/401; 257/674
(58) Field of Classification Search ................ 257/107, 257/288, 401, 666, 674, 686, E23
    See application file for complete search history.

(56) References Cited

U.S. PATENT DOCUMENTS

| 5,008,736 | A * | 4/1991 | Davies et al. ............... 361/103 |
| 5,901,901 | A * | 5/1999 | Schneegans et al. ........ 228/254 |
| 6,268,659 | B1 * | 7/2001 | Huebner et al. ............. 257/766 |
| 6,307,755 | B1 * | 10/2001 | Williams et al. ............ 361/813 |
| 6,657,874 | B2 * | 12/2003 | Yu ............................... 363/50 |
| 2002/0113247 | A1 * | 8/2002 | Magri et al. ................ 257/133 |
| 2005/0167789 | A1 * | 8/2005 | Zhuang ....................... 257/659 |
| 2006/0246267 | A1 * | 11/2006 | Jain ........................... 428/195.1 |
| 2006/0267021 | A1 * | 11/2006 | Rowland et al. ............. 257/77 |
| 2007/0090496 | A1 * | 4/2007 | Otremba ..................... 257/666 |
| 2007/0138651 | A1 * | 6/2007 | Hauenstein ................. 257/782 |

FOREIGN PATENT DOCUMENTS

| DE | 19606101 | 8/1997 |
| DE | 19935100 | 3/2001 |
| DE | 1012441 | 4/2002 |

OTHER PUBLICATIONS

Thomas Studnitzky and Rainer Schmid-Fetzer, "Diffusion Soldering for Stable High-Temperature Thin-Film Bonds", Dec. 2002, Springer Boston, Journal of the Minerals, Metals and Materials Society, JOM, vol. 54, No. 12, pp. 58-63.*

* cited by examiner

*Primary Examiner*—M. Wilczewski
*Assistant Examiner*—Telly D Green
(74) *Attorney, Agent, or Firm*—Dicke, Billig, Czaja PLLC

(57) ABSTRACT

An electronic component and method for its assembly is disclosed. In one embodiment, the electronic component comprises at least two semiconductor components and a circuit carrier comprising a die pad and a rewiring structure. At least one semiconductor component is a vertical semiconductor power switch having an upper surface comprising at least one electrode and a lower surface comprising at least one electrode. The lower side of the at least two semiconductor components is attached to the die pad by a diffusion solder bond.

31 Claims, 4 Drawing Sheets

ELECTRONIC COMPONENT AND METHOD FOR ITS ASSEMBLY

FIELD OF THE INVENTION

The invention relates to electronic components, in particular to electronic components which comprise at least one vertical semiconductor power switch and at least one further semiconductor component and to methods for assembling electronic components.

BACKGROUND

Multi-chip electronic components typically include two or more semiconductor components which are mounted adjacent to one another on a die pad. For multi-chip modules including vertical power MOSFET devices, the electrical performance of the module is dependent on the area or lateral dimensions of the MOSFET devices. Consequently, the electrical performance of the module is dependent on the desired size of the package, since the size of the package limits the lateral size of the die pad which in turn defines the maximum area available for the devices.

In practice, the maximum possible lateral area of the devices is less than the area of the die pad since an area around the semiconductor device is left unoccupied to accommodate the so-called "solder splash". The semiconductor components are typically mounted on the die pad by providing a soft solder deposit on the die pad and pressing the semiconductor component into the soft solder deposit. Consequently, solder is pushed from the area underneath the semiconductor component into adjacent regions, the so called "solder splash". This spreading of the soft solder deposit limits the area available for the semiconductor components within the area of the die pad. Therefore, the electrical properties achievable within a package of a certain size is limited.

A further problem associated with the spread of the solder deposit may occur if a multi-step die attach method is used. During the attachment of a second or subsequent die, the soft solder attaching the first die remelts. This can result in movement of the first die, particularly if the two solder deposits bridge to form a single solder deposit. Due to the different sizes of the semiconductor components, the components may sink into the solder deposit by different amounts so that the upper surfaces of the components lie in different planes and may lie at inclined angle to the die pad. This is disadvantageous as the contact areas may not lie in the desired position and, consequently, the wire bonds may not be formed correctly from the components to the leadframe or rewiring structure of the electronic component.

To overcome these problems, it is known to use a larger die pad and consequently a larger package if the area of the semiconductor components is to be increased. However, a larger package is often undesired due to the increasing demands for miniaturization of electronic components along with the demand for increased performance for a package of a given size.

There is a need for an electronic component which is able to accommodate semiconductor components of a larger lateral area so as to provide an improved electrical performance within a defined package footprint.

There is also a need to provide methods by which an electronic component with an increased area of semiconductor components may be cost-effectively manufactured.

SUMMARY

The present invention provides an electronic component and method of assembly. In one embodiment, the present invention provides an electronic component having at least two semiconductor components, each semiconductor component including an upper side and a lower side, wherein at least one semiconductor component is a vertical semiconductor power switch. The upper surface of the vertical semiconductor power switch includes at least one electrode and the lower surface of the vertical semiconductor power switch includes at least one electrode. A circuit carrier is provided including a die pad and a rewiring structure wherein lower side of the at least two semiconductor components is attached to the die pad by a diffusion solder bond.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
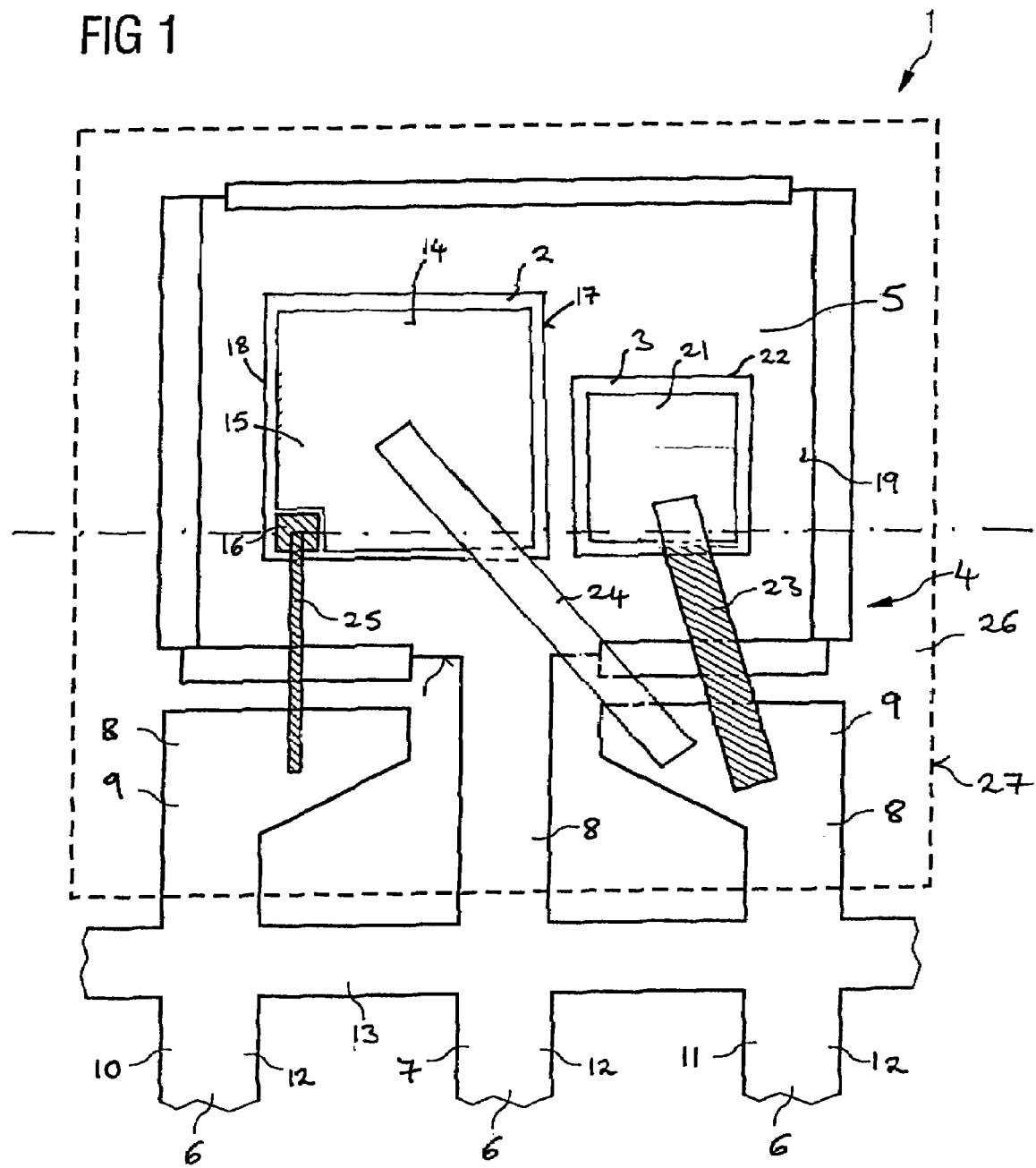
FIG. 1 illustrates a plan view of a semiconductor module according to a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides an electronic component which is able to accommodate semiconductor components of a larger lateral area so as to provide an improved electrical performance within a defined package footprint.

The present invention also provides methods by which an electronic component with an increased area of semiconductor components may be cost-effectively manufactured.

In one embodiment, the invention provides an electronic component having at least two semiconductor components. Each semiconductor component includes an upper side and a lower side. At least one semiconductor component is a vertical semiconductor power switch. The upper surface of the vertical semiconductor power switch includes at least one electrode and the lower surface of the vertical semiconductor power switch includes at least one electrode. The electronic component further includes a circuit carrier which includes a die pad and a rewiring structure. The lower side of the at least two semiconductor components is attached to the die pad by a diffusion solder bond.

At least two semiconductor components are, therefore, mounted side by side in surface to surface contact with the upper surface of the die pad by a diffusion solder bond. The diffusion solder bond provides a mechanical and electrical connection between the lower side of the two semiconductor components and the die pad. In an embodiment, the at least two semiconductor components mounted on the die pad in surface to surface contact with the die pad are vertical semiconductor components.

In this description, "upper" and "lower" are used to define the side of the semiconductor components in relation to the die pad of the component. "lower" refers to the side which faces towards the die pad and "upper" refers to the side which faces away from the die pad.

The phrase "diffusion solder bond" is used in this context to denote a connection structure which is mechanically and electrically attached to a surface by a layer comprising intermetallic phases. The intermetallic phases are located at the interface between the connection structure and the surface. The intermetallic phases are formed as a result of a diffusion soldering process and comprise chemical elements of the diffusion solder and of at least one contiguous material, for example the die pad.

A diffusion solder bond has the advantage that the melting point of the intermetallic phases is higher than the melting point of the diffusion solder itself. Consequently, the bond which is formed as a result of the diffusions process has a melt temperature which is higher than the temperature at which the bond is formed. A diffusion solder bond, therefore, has the advantage that a second semiconductor component may be mounted on the die pad in a second diffusion bonding step without the diffusion solder bond connecting the first semiconductor component to the die pad melting. Consequently, the problems associated with soft solder bonding, in particular, movement of the semiconductor components during subsequent die attach processes, are avoided. Diffusion solder bonding is, therefore, particularly advantageous for multi-chip modules in which two or more chips or semiconductor components are mounted adjacent to one another directly on the die pad.

Diffusion solder bonds are typically thinner than soft solder bonds. Diffusion solder bonds are typically less than 10 μm in thickness whereas soft solder bonds typically have a thickness of around 100 μm. The smaller thickness of the diffusion solder bond has the advantage that the thermal dissipation from the semiconductor component into the die pad is improved and the thermal performance of the package is improved.

A diffusion solder bond has the further advantage that the lateral area occupied by the bond substantially corresponds to the lateral area of the semiconductor component. In contrast to soft solder joints, the structure for producing the diffusion solder bond, is fabricated by depositing the structure on the semiconductor component. The semiconductor component is then brought into contact with the die pad at an appropriate temperature to produce the bond.

This arrangement in combination with the thinner layer results in the diffusion solder bond having lateral dimensions substantially corresponding to the area of the semiconductor components. Therefore, the components may be positioned on the die pad more closely to one another. Furthermore, since regions around the components are not required to accommodate excessive solder, larger components may be mounted on a die pad of a given size. In this way, the electrical performance of the package may be improved as components with a larger area can be accommodated within the package.

In one embodiment of the invention, the diffusion solder bond comprises an alloy. The alloy may comprise intermetallic phases comprising tin and one of the group of elements consisting of silver, gold, copper and indium. These alloys are the result of the use of tin-based solders and have the advantage that the melting temperature of the diffusion solder is less than around 230° C.

The diffusion solder bond has a thickness t, where t may be $0.1\ \mu m \leq t \leq 100\ \mu m$, preferably $0.1\ \mu m \leq t \leq 10\ \mu m$, more preferably $1.5\ \mu m \leq t \leq 3.5\ \mu m$.

In an embodiment of the invention, the diffusion solder bond includes three layers. A contact layer is disposed directly on the lower side of the semiconductor component. The diffusion solder bond further comprises a diffusion barrier layer which is disposed directly on the contact layer and a diffusion solder layer disposed directly on the diffusion barrier layer.

The contact layer provides an ohmic contact to the semiconductor material, typically silicon, of the semiconductor component. The diffusion barrier layer prevents a reaction between the contact layer and the diffusion solder layer which would otherwise affect the composition of the contact layer and diffusion solder layer.

A reaction is undesirable as, firstly, the electrical properties of the contact layer may deteriorate due to the formation of an alloy. Secondly, a reaction between the contact layer and the diffusion solder layer may result in a change in the melting temperature of the diffusion solder and in changes to the intermetallic phase formation process. This can result in an unreliable bond being produced due to the variation in the melting temperature of the diffusion layer.

In an embodiment of the invention, the contact layer consists essentially of aluminium. An aluminium contact layer has the advantage that, in addition to providing a low electrical resistance ohmic contact to silicon, aluminium also has the function of a buffer layer since after repeated thermal cycling, aluminium exhibits liquid-like properties and can absorb mechanical stress which occurs as the result of the different thermal expansion coefficients of the semiconductor component and the metallic die pad to which it is attached. Consequently, the reliability of the package is improved.

The diffusion barrier layer may comprise titanium metal or may consist essentially of titanium. The diffusion barrier layer may also comprise two layers. The first layer may consist essentially of titanium and is disposed directly on the contact layer. The second layer comprises $TiN_x$ and is disposed on the titanium first layer.

The diffusion solder layer comprises an alloy and comprises tin and one of the elements silver, gold, copper and indium. The alloy comprises intermetallic phases which are the result of a reaction between the diffusion solder and the metal of the die pad.

The diffusion solder bond may have a total thickness t where $0.1\ \mu m \leq t \leq 100\ \mu m$, preferably $0.1\ \mu m \leq t \leq 10\ \mu m$, more preferably $1.5\ \mu m \leq t \leq 3.5\ \mu m$. The contact layer may have a thickness a, where 0.01 µm≦a≦10 µm, preferably 0.1 µm≦a≦1 µm. The diffusion barrier layer may have a thickness b, where 0.1 µm≦b≦10 µm, preferably 0.1 µm≦b≦1 µm. The diffusion solder layer may have a thickness c, where 0.1 µm≦c≦80 µm, preferably 0.5 µm≦c≦5 µm.

In an alternative embodiment of the invention, the diffusion solder bond comprises at least a contact layer and a diffusion solder layer. The contact layer comprises one of a metal and an alloy thereof, the metal being one of the group of elements consisting of Ti, Ni and Cr, and the diffusion solder layer comprises an alloy, the alloy comprising Sn and one of the group consisting of Ag, Au, Cu and In.

The diffusion solder bond according to this embodiment may comprise at least one further layer. The at least one further layer is disposed between the contact layer and the diffusion solder layer and comprises one of a metal and an alloy thereof, the metal being one of the group of elements Ni, Au, Ag, Pt and Pd.

The diffusion solder bond may comprise one of the following structures, the first mentioned metal being disposed directly on the silicon of the semiconductor body: Ti, diffusion solder; Ni, diffusion solder; Ti, Ni, diffusion solder, Cr, Ni, diffusion solder; Ti, Au or Ag, or Pt or Pd, diffusion solder; Cr, Au or Ag, or Pt or Pd, diffusion solder, and Ni, Au or Ag, or Pt or Pd, diffusion solder.

The vertical semiconductor power switch may be a MOSFET (Metal Oxide Semiconductor Field Effect Transistor) device or an IGBT (Isolated Gate Bipolar Transistor) device or a BJT (Bipolar Junction Transistor) device. A MOSFET device comprises at least one source electrode and at least one gate electrode disposed on the upper surface and at least one drain electrode disposed on the lower surface of the semiconductor body of the device. An IGBT device comprises at least one emitter electrode, at least one gate electrode disposed on the upper surface and at least one collector electrode disposed on the lower surface of the semiconductor body of the device.

At least one semiconductor component of the electronic component which is mounted directly on the die pad by a diffusion solder bond may be a PIN diode or a Schottky diode. The diode may comprise silicon carbide. A of the diode comprises a cathode contact and the opposing side comprises an anode contact.

In one embodiment of the invention, the electronic component includes a diode and a vertical semiconductor power switch. The vertical semiconductor power switch is an IGBT device or a MOSFET device. The electronic component may include only two semiconductor components of which one is a diode and one is an IGBT or a MOSFET device.

The diode may be electrically connected in parallel with the semiconductor power switch. In a further embodiment, the MOSFET or IGBT and the diode are configured so that the semiconductor diode is a free-wheeling diode.

The diode and vertical semiconductor power switch may be arranged on the die pad so that the electrode disposed on the lower surface of the diode is an anode and the electrode disposed on the lower surface of the MOSFET is a drain electrode. The anode electrode of the diode and the drain electrode of the MOSFET are, therefore, in mechanical and electrical contact with the die pad. The upper surface of the diode includes, therefore, a cathode and the upper surface of the MOSFET comprises at least one source electrode and at least one gate electrode.

Alternatively, the diode may be mounted on the die pad in a flip-chip arrangement, In this arrangement, the electrode disposed on the lower surface of the diode is a cathode and the electrode disposed on the lower surface of the MOSFET is a drain electrode. The drain electrode of the MOSFET and the cathode electrode of the diode are, therefore, in mechanical and electrical contact with the die pad. The upper surface of the diode includes, in this embodiment, an anode electrode. As in the previous embodiment, the upper surface of the MOSFET includes at least one source electrode and at least one gate electrode.

The two arrangements of the diode are also possible for an electronic component in which the vertical semiconductor power switch is an IGBT device. In a first embodiment, the electrode disposed on the lower surface of the diode is an anode. The electrode disposed on the lower surface of the IGBT is an emitter electrode. The anode of the diode and emitter electrode of the IGBT are, therefore, attached directly to the die pad. The upper surface of the IGBT, therefore, includes at least one collector electrode and at least one gate electrode.

In a second embodiment, the electrode disposed on the lower surface of the diode is a cathode and the electrode disposed on the lower surface of the IGBT is an emitter electrode. The cathode of the diode and emitter electrode of the IGBT are, therefore, attached directly to the die pad. As in the previous embodiment, the upper surface of the IGBT includes at least one collector electrode and at least one gate electrode.

In an alternative embodiment, the electronic component may include at least two vertical MOSFET power switches. The semiconductor power switches may be MOSFET devices or IGBT devices. In an embodiment of the invention, the vertical semiconductor power switches are configured in pairs, each forming a half-bridge. The half-bridge may be provided by providing one of the vertical semiconductor power switches of each pair as an n-channel device and one of the vertical power switches of each pair as a p-channel device.

An electronic component including at least two vertical semiconductor power switches may further include at least one control semiconductor die or chip. The control semiconductor die may be mounted on the die pad by adhesive. Alternatively, the control semiconductor die may be mounted on the upper side of one of the semiconductor components mounted on the die pad by a adhesive means. This arrangement has the advantage that the area of the semiconductor power transistors can be maximised to improve the electrical performance of the package.

In an embodiment of the invention, the circuit carrier is a lead frame including a die pad and a plurality of leads. The plurality of leads provide the rewiring structure. The leads may protrude from the component to provide pins as outer contact areas. Alternatively, the leads may lie in the bottom surface of the component and provide a surface mountable package.

In a further embodiment of the invention, the circuit carrier is a printed circuit board which includes a die pad and a rewiring structure. The rewiring structure comprises a plurality of inner contact pads to which the semiconductor components are electrically connected. The rewiring structure may also includes a plurality of outer contact pads which enable the component to be mounted onto a higher level circuit board and a plurality of conductor tracks which electrically connect the inner contact pads and the outer contact pads.

In a further embodiment of the invention, the circuit carrier includes a ceramic substrate which may be a so-called direct copper bond ceramic substrate.

The electronic component may further include a plurality of bond wires or several pluralities of bond wires. The input and output electrodes of the vertical power switch may be electrically connected to the rewiring structure by a first plurality of bond wires. The control electrodes such as the gate electrode of the vertical power switch may be electrically connected to the rewiring structure and, in the case that two or more vertical semiconductor power switches are provided in the electronic component, to the further vertical semiconductor power switches, by a second plurality of bond wires.

The first plurality of bond wires typically has a diameter of 200 to 300 µm and comprises aluminium. The second plurality of bond wires typically comprises gold and has a diameter of 20 to 100 µm.

The electronic component may further include a plastic housing. The plastic housing may comprise encapsulation resin such as an epoxy resin which encapsulates at least the semiconductor components. The plastic housing may also encapsulate the inner portions of the rewiring structure, the bond wires and at least the upper surface of the die pad. In a further embodiment of the invention, the rear side of the die pad is also encapsulated in the plastic housing.

The electronic component may have a package outline conforming to a JEDEC standard package outline, for example a TO-220 package. Package outline is used in this context to define the dimensions of the plastic housing of the component as well as the layout and size of the leadframe including the number of leads or pins and their lateral size and spacing. It may be advantageous if the electronic component has a package outline which conforms to a standard JEDEC package outline as the module can be more easily fitted onto existing circuit boards that conform to these standards.

The invention also relates to methods of assembling an electronic component having at least the following process:
(a) providing at least two semiconductor components, each semiconductor component having an upper side and a lower side, wherein at least one semiconductor component is a vertical semiconductor power switch, the upper surface of the vertical semiconductor power switch having at least one electrode and the lower surface of the vertical semiconductor power switch having at least one electrode, and wherein means for producing a diffusion solder bond is disposed on the lower side of each of the semiconductor components;
(b) providing a circuit carrier having a die pad and a rewiring structure;
(c) heating the circuit carrier to a selected temperature;
(d) applying the lower side of a first semiconductor component to the die pad of the circuit carrier while the circuit carrier is at the selected temperature;
(e) producing a diffusion solder bond between the first semiconductor component and the die pad;
(f) applying the lower side of a second semiconductor component to the die pad of the circuit carrier while the circuit carrier is at the selected temperature; and
(g) producing a diffusion solder bond between the second semiconductor component and the die pad.

Each semiconductor component which is to be mounted on the die pad has a lower side which includes means for producing a diffusion solder bond at the open surface of the lower side of the semiconductor component. Each semiconductor component which is to be mounted on the die pad of the circuit carrier is mounted on the die pad in a separate process.

The diffusion solder bond is produced by heating at least the die pad of the circuit carrier to a selected temperature and applying the lower side of the semiconductor component to the die pad while the die pad is at the selected temperature.

The means for providing a diffusion solder bond is, therefore, brought into surface to surface contact with the upper surface of the die pad. Next, a diffusion solder bond is produced between the semiconductor component and the die pad. This is achieved by maintaining the surface to surface contact between the means for producing the diffusion solder bond and the die pad for a selected time. During this time, intermetallic phases are formed between the means for producing the diffusion solder bond and the upper surface of the die pad. These intermetallic phases have a higher melting point than the melting point of the means for producing the diffusion solder bond. Therefore, a mechanical and electrical connection is formed by diffusion solder bond due to the solidification of the means for the diffusion solder bond.

As the produced diffusion solder bond has a higher melting point than the selected temperature to which the circuit carrier is heated, a second or further semiconductor components may be mounted by a diffusion solder process on the die pad without the diffusion solder bond already produced between the first semiconductor and the die pad melting. Consequently, the reliability of the die attach or component attach process is proved as the problems associated with the undesirable movement of the components during subsequent attachment is avoided.

The two or more semiconductor components which are to be mounted on the die pad may comprise essentially identical means for producing the diffusion solder bond. The diffusion solder bond has a lateral area which corresponds substantially to the area occupied by the semiconductor component. The components may be mounted more densely on the die pad and components with a larger lateral area may be mounted on the die pad since the space reserved for excessive solder can be reduced.

In one embodiment of the invention, processes (d) and (e) listed above are repeated for each of the semiconductor components which are to be attached directly on the die pad in surface to surface contact with the upper surface of die pad. In an alternative embodiment, two or more components may be applied to the die pad during the same process.

Processes (c) to (g) may be performed in one of an inert atmosphere and forming gas. At inert atmosphere may be provided by a noble gas atmosphere such as under $N_2$ or Argon gas. An inert atmosphere may also be provided by a vacuum. Forming gas refers to a gas which comprises a proportion of hydrogen, typically less than 10%, in an inert base gas such as nitrogen or argon. Ar with 4% $H_2$ and Ar with 1% $H_2$ may be used. An inert atmosphere or a forming gas atmosphere hinders or prevents the formation of oxides during the diffusion solder bond process. This ensures a low electrical resistance bond and prevents the formation of brittle metal oxides in the joint.

In an embodiment, the die pad is reheated to the desired temperature after a semiconductor component is attached to the die pad and before a subsequent semiconductor component is attached to the die pad. This reheating process may be performed between each component attach process or after two or more component attach processes depending on the reduction in the temperature of the die pad.

The selected temperature to which the circuit carrier is heated is selected to be higher than the melting point of the means for producing a diffusion solder bond or diffusion solder. This ensures the production of a diffusion solder bond when the means for producing the bond disposed on the lower surface of the component is brought into surface to surface contact with the upper surface of the die pad. The selected temperature T may be $150°\ C. \leq T \leq 280°\ C.$, preferably $150°\ C. \leq T \leq 230°\ C.$ The means for producing a diffusion solder bond may comprise a tin-based diffusion solder which has a melting temperature Tm in the range $150°\ C. \leq Tm \leq 280°\ C.$, preferably $150°\ C. \leq Tm \leq 230°\ C.$ After its formation, the diffusion solder bond comprises an alloy. The alloy comprises Sn and one of the group of elements consisting of Ag, Au, Cu and In.

The means for producing a diffusion solder bond is provided with a thickness t, where 0.1 µm≦t≦100 µm, preferably 0.1 µm≦t≦10 µm, more preferably 1.5 µm≦t≦3.5 µm.

In an embodiment, the means for producing a diffusion solder bond comprises a contact layer disposed directly on the lower side of the semiconductor component, a diffusion layer disposed on the directly contact layer, and a diffusion solder layer disposed directly on the diffusion layer.

The diffusion solder layer comprises a tin-based diffusion solder which has a melting temperature Tm in the range 150° C.≦Tm≦280° C., preferably 150° C.≦Tm≦230° C.

The means for producing a diffusion solder bond may have a thickness t where 0.1 µm≦t≦100 µm, preferably 0.1 µm≦t≦10 µm, more preferably 1.5 µm≦t≦3.5 µm. The contact layer may have a thickness a, where 0.01 µm≦a≦10 µm, preferably 0.1 µm≦a≦1 µm. The diffusion barrier layer may have a thickness b, where 0.1 µm≦b≦10 µm, preferably 0.1 µm≦b≦1 µm. The diffusion solder layer may have a thickness c, where 0.1 µm≦c≦80 µm, preferably 0.5 µm≦c≦5 µm.

After the semiconductor components are mounted on the die pad, electrical connections between the electrodes disposed on the upper surface of the semiconductor components and the rewiring structure may be produced. In an embodiment, the electrical connections are provided by bond wires. Electrical connection may also be provided which extend between the semiconductor components. These electrical connection may also be provided by bond wires. Bond wires of different diameters and/or materials may be provided within a package. For example, control bond wires typically have smaller diameter than supply bond wires. The different types of bond wires may be produced in different wire-bonding processes.

In a further process, the semiconductor components, at least the upper surface of the die pad and the bond wires may be embedded in a plastic encapsulation, such as an epoxy resin, to provide a plastic housing for the electronic component.

In a further embodiment of the invention, the electronic component includes further semiconductor components which are not mounted in surface to surface contact with the die pad. The further semiconductor components are mounted on the upper surface of at least one of the components mounted directly on the die pad.

The components stacked on the top of the diffusion solder bonded component may include one or more control integrated circuit semiconductor chips. These further components may be mounted on the electrode positioned on the upper surface of the semiconductor components by adhesive. The stacked components may be electrically connected to be rewiring structure of the circuit carrier and/or the other components mounted on the die pad by a plurality of bond wires.

The use of a thin diffusion solder bond on the rear side metallization of the semiconductor components enables the problems associated with solder splash or the undesired lateral spreading of soft solder in chip by chip multi-chip components to be avoided. The maximum possible chip area or semiconductor area can be significantly increased as space between the chips can be reduced as additional space around the semiconductor dies or chips it is not required to accommodate the undesired solder spread. The electrical performance of a package of a given size can, therefore, be improved.

FIG. 1 illustrates a plan view of a semiconductor module 1 according to a first embodiment of the invention. The semiconductor module 1 includes two vertical semiconductor components, a vertical power switch 2, which in this embodiment is an IGBT (Isolated Gate Bipolar Transistor) device, and a diode 3.

The semiconductor module 1 further includes a leadframe 4 which includes a die pad 5 and three leads 6. The die pad 5 is approximately rectangular and the three leads 6 are arranged adjacent one of the long sides of the die pad 5. The three leads 6 extend in directions substantially parallel to one another and substantially perpendicularly to the edge of the die pad 5.

The central lead 7 extends from approximately the centre of the long side of the die pad 5 and is therefore integral with the die pad 5. The two further leads 6 are arranged one on each side of the central lead 7. The inner portion 8 of each of these leads 6 extends inwardly towards the central lead 7 to provide a contact area 9. The contact areas 9 are spaced at a distance from the long side of the die pad 5 and are not in mechanical contact with the die pad 5.

In this embodiment of the invention, the left hand lead 10 provides a gate lead and the right hand lead 11 provides an input lead to the module 1. The input lead 11 is typically denoted as the emitter lead. The central lead 7 is typically denoted as a collector lead. The outer portion 12 of each of the leads 6 provides the external contacts of the module 1. In the plan view of FIG. 1, the outer portions 12 of the three leads 6 are mechanically connected by a tie bar 13 which holds the leadframe 4 in a lead frame strip (not shown in the figure) which includes a plurality of such leadframes 4. The tie bar 13 is removed after the assembly of the semiconductor component 1 to mechanically and electrically separate the three leads 6 from each other.

The IGBT device 2 includes an upper surface 14 on which an emitter electrode 15 and a gate electrode 16 are disposed. The lower surface 17 of the IGBT device 2 comprises a collector electrode 18 which cannot be and seen in the plan view of FIG. 1. The lower surface 17 of the IGBT device 2 is mechanically and electrically connected to the upper surface 19 of the die pad 5 by a diffusion solder bond 20. The diffusion solder bond 20 cannot be seen in the plan view of FIG. 1 and is discussed in more detail with reference to the cross-sectional view of FIG. 2.

The diode 3 of the semiconductor module 1 includes an upper surface with an anode electrode 21 and the lower surface with a cathode electrode 22. The lower surface of diode 3 and, therefore, the cathode electrode 22 is mechanically and electrically connected to the upper surface 19 of the die pad 5 by a diffusion solder bond 20 which cannot be seen in the plan view of FIG. 1. The diode 3 is positioned on the upper surface 19 of the die pad 5 adjacent to the IGBT device 2.

Since the IGBT device 2 and the diode 3 are attached to the die pad 5 by a diffusion solder bond, the regions surrounding the IGBT device 2 and diode 3 are free from solder. The region of the upper surface 19 of the die pad 5 which is covered by the diffusion solder bond 20 substantially corresponds to the lateral size of the IGBT device 2 and diode 3. This arrangement is more clearly seen in the cross-sectional view of FIG. 1.

The semiconductor module 1 further includes bond wires which extend between the electrodes 15, 16, 21 positioned on the upper surface of the semiconductor components 2, 3 and the leads 6 of the leadframe 4.

A first bond wire 23 extends between the anode contact 21 of the diode 3 and the contact area 9 of the emitter lead 11. A second bond wire 24 extends between the emitter electrode 15 of the IGBT and the inner contact area 9 of the emitter lead 11. The first bond wire 23 and second bond wire 24 include aluminium and each have a diameter of approximately 250 μm. A third bond wire 25 extends between the gate electrode 16 on the upper surface 14 of the IGBT device 2 and the inner contact area 9 of the gate lead 12. The third bond wire 25 has a diameter of approximately 75 μm and comprises gold.

The cathode contact 22 and the collector electrode 17 of the IGBT device 2 are electrically connected by a diffusion solder bond 20 to a single die pad 5 and the central collector lead 7 of the lead frame 4. The semiconductor module 1, therefore, includes a diode 3 which is electrically connected in parallel with the IGBT device 2 and is configured as a freewheeling diode.

The semiconductor module a 1 further includes epoxy resin 26 which encapsulates the upper surface 19 of the die pad 5, inner portions 8 of the leads 6, the IGBT device 2, the diode 3, and the three bond wires 23, 24, 25. The outer surfaces 27 of the epoxy resin 26 provide the outer surfaces of the plastic housing of the semiconductor module 1.

The form and dimensions of the outer surfaces 27 of the plastic housing 26 and the size and arrangement of the leads 6 are typically those of a known package type which conforms to agreed industry standards such as JEDEC standards. Possible package types are TO-252, TO-263, TO-220 and TO-247, for example.

Figure 2:
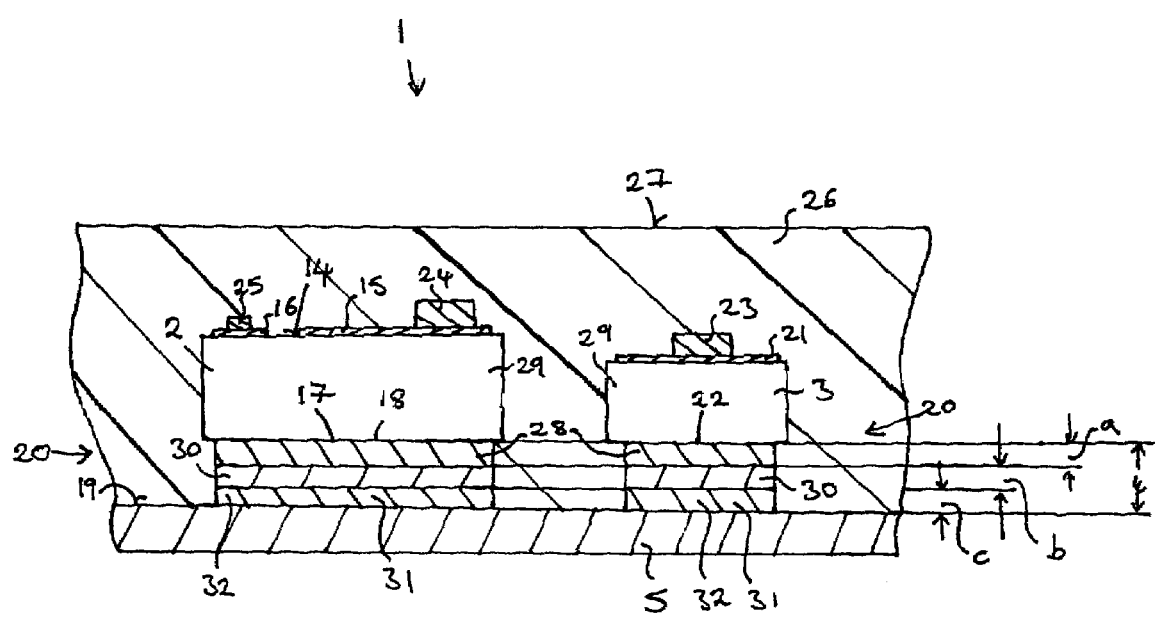
FIG. 2 illustrates a cross-sectional view of the semiconductor module of FIG. 1.

FIG. 2 illustrates a cross-sectional view of the semiconductor module 1 of FIG. 1 and in particular illustrates the die pad 5 on which the IGBT device 2 and diode 3 are mounted.

The lower surface of the IGBT device 2 which includes the collector electrode 17 is attached to the upper surface 19 of the die pad 5 by a diffusion solder bond 20. Similarly, the cathode electrode 22 disposed on the lower surface of the diode 3 is mounted on the upper surface 19 of the die pad 5 by a diffusion solder bond 20 which is essentially the same as that of the IGBT device 2. The diffusion solder bond 20 has a total thickness t which, in this embodiment of the invention, is 2 microns (μm).

The diffusion solder bond 20 comprises three layers. A contact layer 28 is positioned directly on the semiconductor body 29 of the IGBT device 2 and the diode 3 respectively. The contact layer 29 consists essentially of aluminium and provides a low electrical resistance ohmic contact to the silicon of the semiconductor body 29. The contact layer has a thickness a which, in this embodiment, is approximately 0.8 μm.

The diffusion solder bond 20 further includes a diffusion barrier layer 30 which is disposed directly on the contact layer 28. The diffusion barrier layer 30 consists essentially of titanium metal and has a thickness b of approximately 0.2 μm. The diffusion barrier layer 30 prevents a reaction between the aluminium of the contact layer 28 and the diffusion solder layer 31.

The diffusion solder layer 31 is disposed directly on the diffusion barrier layer 30 and has a thickness of around 0.8 μm. The diffusion solder layer 30 includes intermetallic phases 32. The diffusion solder layer 31 is provided on the lower surfaces of the IGBT device 2 and diode 3 in the form of a tin-based diffusion solder comprising tin and gold and/or silver. The semiconductor components 2, 3 are mounted on the die pad 5 by heating the die pad 5 to a temperature above the melting point of the diffusion solder layer 31.

In a first process, the diode 3 is mechanically and electrically attached to the upper surface 19 of the die pad 5 by pressing the diffusion solder layer 31 positioned on the rear surface of diode 3 onto the upper surface 19 of the die pad 5. The diffusion solder melts forming intermetallic phases 32 which have a higher melting point than the melting point of the diffusion solder. The diffusion solder bond is, therefore, formed due to the solidification of the region between the diffusion barrier layer 30 and the upper surface 19 of the die pad 5.

In a subsequent process, the IGBT device 2 is mounted on the die pad 5 adjacent to the diode 3. The die pad 5 is heated to a temperature such that the diffusion solder layer 31 melts when it is placed on the upper surface 19 of the die pad 5. Since the intermetallic phases 32 forming the mechanical bond at the interface between the upper surface 19 of the die pad 5 and diode 3 have a higher melting point than this temperature, the diode 3 remains attached to the die pad 5 during the second diffusions solder process.

The diffusion solder bond 20 is produced by depositing a first contact layer 28 of aluminium on the lower surface of the semiconductor body 29 of the IGBT device 2 and diode 3 respectively. The diffusion barrier layer 30 is then deposited directly on the contact layer 28 and the diffusion solder layer 31 is deposited directly on the diffusion barrier layer 30. Consequently, the lateral dimensions of the diffusion solder bond 20 are approximately those of the lateral area of the IGBT device 2 or diode 3 respectively.

In contrast to diffusion soldering, a soft solder deposit which has a thickness of at least 50 μm, typically 100 μm is deposited on the die pad and the semiconductor component pressed into the soft solder deposit. This causes the soft solder to spread outwardly occupying space on the die pad.

According to the invention, the mechanical bond and electrical connection between the IGBT device 2 and the die pad 5 as well as the mechanical bond and electrical connection between the diode 3 and the die pad 5 is produced by the melting and solidification of the thin diffusion solder layer 31. Consequently, in a diffusions solder process large quantities of molten solder are not created as is in the case of a soft solder bond. The lateral area occupied by the diffusion solder bond 20, therefore, remains essentially that of the semiconductor component. This enables the lateral size of the semiconductor components to be increased as additional space adjacent to the semiconductor components is not required to accommodate excessive solder displaced outwards from the components during the component attach process.

After the IGBT device 2 and the diode 3 have been attached to the upper surface 19 of the die pad 5, the bond wire connections 23, 24 are produced between the anode contact 21 on the upper surface of the diode 3 and the inner contact area 9 of the emitter lead 11 and between the emitter electrode 15 disposed on the upper surface 14 of the IGBT device 2 and the inner contact area 9 of the emitter lead 11.

In a second wire-bonding process, the gate electrode 16 positioned on the upper surface 14 of the IGBT device 2 is electrically connected by the bond wire 25 which extends between the gate electrode 16 and the contact area 9 of the inner portion 8 of the gate lead 10.

The upper surface 19 of the die pad 5, the bond wires 23, 24, 25, the IGBT device 2, the diode 3 and the inner portions 8 of the leads 6 are encapsulated in epoxy resin in a mold transfer process to provide the semiconductor module 1.

In an alternative embodiment not shown in the figures, the diode 3 may be mounted on the upper surface 19 of the die pad 5 so that the cathode electrode 21 faces downwards and is attached to the upper surface 19 of the die pad 5 by a diffusion solder bond 20 according to one of the embodiments of the invention. The anode electrode 22, therefore, faces upwards and is electrically connected to the rewiring structure by bond wires.

Figure 3:
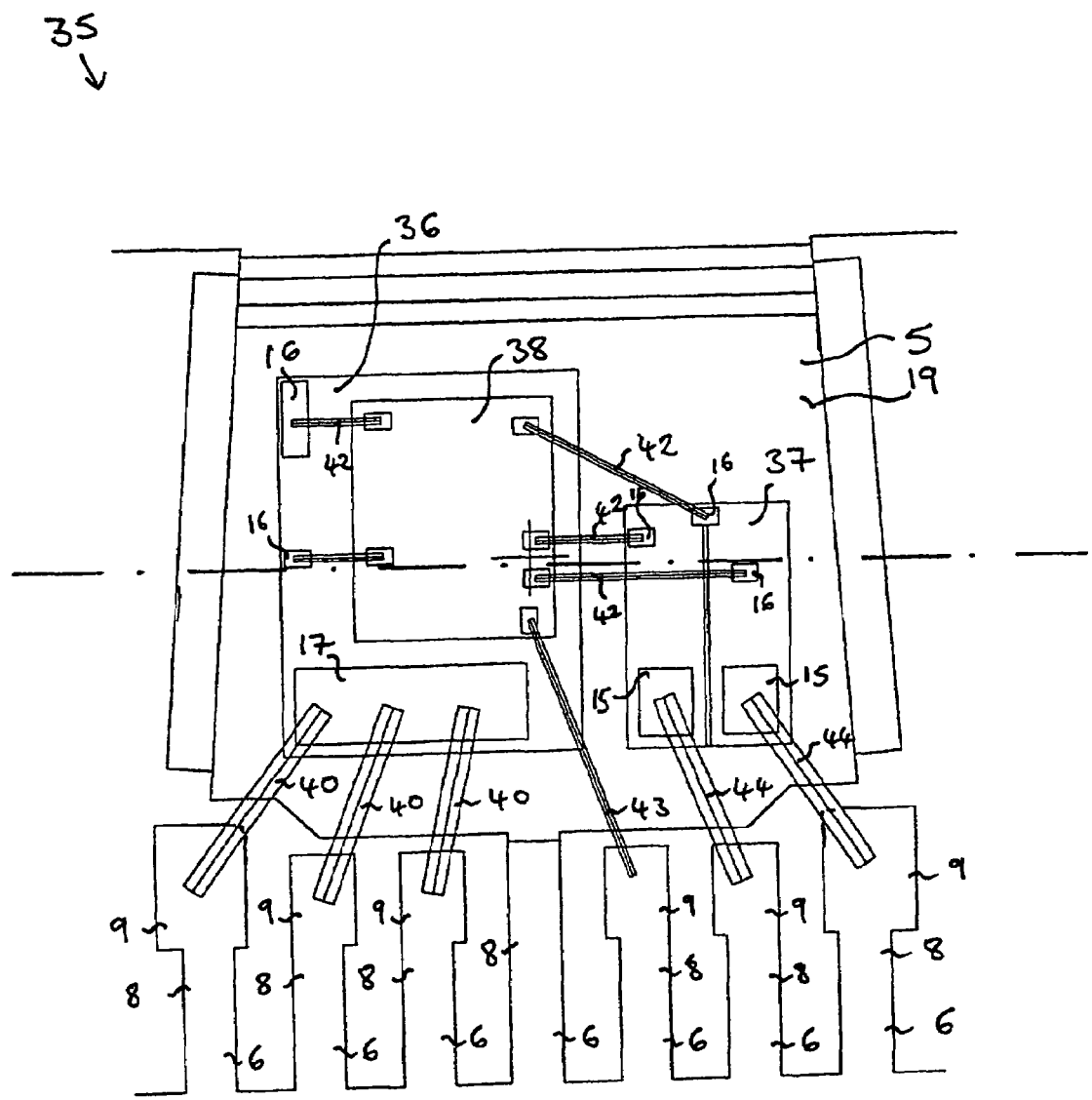
FIG. 3 illustrates a plan view of a semiconductor module according to a second embodiment of the invention.

FIG. 3 illustrates a top view of an electronic component 35 according to a second embodiment of the invention. Parts of the electronic component 35 which are essentially the same or perform the same function as in the electronic component 1 illustrated in FIGS. 1 and 2 are indicated with the same reference number and are not necessarily described in detail again.

The electronic component 35 comprises two MOSFET devices 36, 37 and a control semiconductor chip 38 in addition to a lead frame 4 which comprises a die pad 5 and seven leads 6. The seven leads are arranged adjacent one side of the die pad 5 and extend in directions substantially perpendicular to the die pad 5. The seven leads 6 are arranged substantially parallel to one another. The central lead extends from the die pad 5 and is integral with the die pad 5. The further leads 6 each have a contact area 9 at the innermost portion. The contact area 9 is spaced at a distance from the edge of the die pad 5 and is not in direct mechanical contact with the die pad 5.

The first MOSFET devices 36 is a p channel MOSFET device which comprises a drain electrode 17 and two gate electrodes 16 on its upper surface 14. The source electrode 15 is disposed on the lower surface 41 of the MOSFET device 36 and is mechanically and electrically connected to the upper surface 19 of die pad 5 by a diffusion solder bond 20. This arrangement can be more clearly seen in the cross-sectional view of FIG. 4.

The electronic component illustrated in FIG. 3, therefore, provides a half-bridge arrangement of the two MOSFET devices 36, 37.

The second MOSFET device 37 is mounted on the die pad five adjacent the first MOSFET device 36. The second MOSFET device 37 is an n channel MOSFET device and includes two source electrodes 15 and three gate electrodes 16 on its upper surface 14. A drain electrode 17 is arranged on its lower surface 41 and is mechanically and electrically connected to the upper surface 19 of the die pad 5 by a diffusion solder bond 20. This arrangement is also illustrated in the cross-sectional view of FIG. 4.

The control semiconductor chip 38 is mounted on the upper surface 14 of the first MOSFET device 36 in a region of the upper surface 14 which is not occupied by the drain electrode 17 or the gate electrodes 16. The semiconductor control switch 38 is attached to the upper surface 14 of the first MOSFET device 36 by an adhesive 39 as shown in the cross-sectional view of FIG. 4.

The drain electrode 17 of the first MOSFET device 36 is electrically connected by three bond wires 40, each bond wire 40 extending between a lead 6 and the drain contact 17 positioned on the upper surface 14 of the MOSFET device 36. The gate electrodes 16 positioned on the upper surface 14 of the first MOSFET device 36 are electrically connected by bond wires 42 to the upper surface of the control semiconductor chip 38. The control semiconductor chip 30 is also electrically connected to the gate electrodes 16 positioned on the upper surface 14 of the second MOSFET device 37 by further bond wires 42. The semiconductor control switch 38 is electrically connected by bond wire 43 to a lead 6 of the lead frame. A fourth plurality of bond wires 44 is provided, a bond wire 44 extending between each of two leads 6 of the lead frame 4 and each of the two source electrodes 16 positioned on the upper surface of the second MOSFET device 37.

Figure 4:
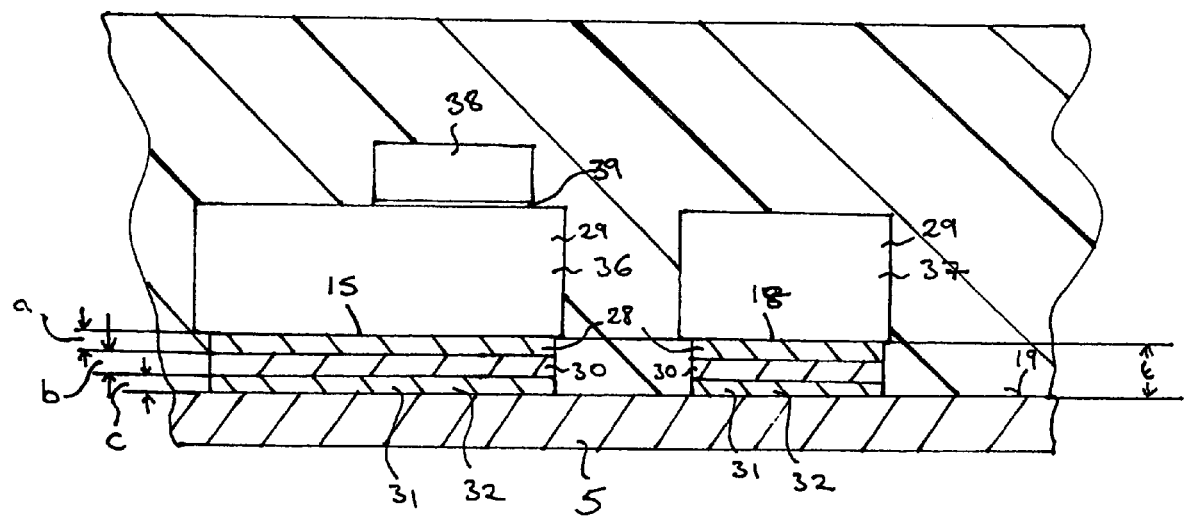
FIG. 4 depicts a cross-sectional view of the semiconductor module of FIG. 3.

FIG. 4 illustrates a cross-sectional view of the electronic component 35 of FIG. 3. The configuration of the diffusion solder bond 20 those between the lower surface 41 of each of the MOSFET devices 36, 37 is illustrated in this cross-sectional view.

The first MOSFET device 36 is a p channel MOSFET device so that its source electrode 15 is located on the lower surface 41 of the body 29 of the MOSFET device 36. The source electrode 15 is mechanically and electrically detached to the upper surface 19 of the die pad 5 by a diffusion solder bond 20 which comprises three layers.

The first layer 28 is a contact layer and includes aluminium and is in direct surface to surface contact with the body 29 of the MOSFET device 36. A diffusion barrier layer 30 which includes a titanium is disposed directly on the contact layer 28. A diffusion solder layer 31 is disposed directly between the diffusion barrier layer 28 and the upper surface 19 of the die pad 5 and includes intermetallic phases 32 which are the result of a diffusion solder process. The intermetallic phases 32 comprise tin and copper. Similarly, the lower surface 41 of the second MOSFET device 37 is mechanically and electrically attached to the upper surface 19 of the die pad 5 by a diffusion solder bond 20. The diffusion solder bond 20 is essentially the same as that which attaches the lower surface 41 of the first MOSFET device 36 to the upper surface 19 of the die pad 5.

The control semiconductor chip 38 which includes the MOSFET drive circuitry is mounted on the upper surface 14 of the first MOSFET device 36 by an adhesive layer 39.

The electronic component 35 was assembled by firstly providing a lead frame strip (not shown in the figures) which includes a plurality of lead frames 4, each lead frame 4 providing a lead frame for a single electronic components. In a first diffusion solder process, the first MOSFET 36 was attached to the upper surface 19 of the die pad 5.

This was carried out by providing the lower surface 41 of the MOSFET device 36 with a diffusion solder bond structure which comprises the first layer 28 of aluminium disposed directly on the silicon 29, a diffusion barrier layer 30 of a titanium disposed on the aluminium layer 28 and a diffusion solder layer including tin disposed on the diffusion barrier layer 30.

The lead frame 4 was then heated to a temperature above the melting point of the diffusion solder layer. The lower surface 41 of the MOSFET device 36 was then brought into surface to surface contact with the upper surface 19 of the die pad 5. The diffusion solder layer melted forming intermetallic phases 32 which have a higher melting point than that of the solder from which they were formed. Consequently, the MOSFET device 36 is mechanically attached to the die pad 5 by a solidification of the interface between the diffusion barrier layer 30 and the upper surface 19 of the die pad 5.

In a second diffusion solder process, the second MOSFET device 37 was attached to the die pad 5. The second MOSFET device 37 was also provided with a diffusion solder bond structure consisting of three layers. A first layer of aluminium is positioned directly on the silicon body 29 of the MOSFET device 37. A diffusion barrier layer 30 of titanium is arranged on the aluminium layer and a diffusion solder layer comprising tin (not illustrated in the figures) was disposed on the titanium layer 30.

The die pad 5 was again heated to a temperature above the melting point of the diffusion solder and the lower surface 41 of the second MOSFET device 37 brought into surface to surface contact with the upper surface 19 of die pad 5.

The diffusion solder melted and intermetallic phases 32 were formed between the diffusion solder and copper of the die pad 5. These intermetallic phases 32 have a higher melting point than the diffusion solder so that the mechanical and electrical attachment of the MOSFET device 37 occurs by a solidification of the interface between the MOSFET device 37 and the die pad 5.

Since the temperature to which the die pad 5 was heated is lower than the melting point of the intermetallic phases 32 forming the diffusion solder bond layer 31, the diffusion solder bond 20 positioned between the first MOSFET device 36 and the die pad 5 remained solid during the second diffusion solder process.

The diffusion solder bond may include alternative structures which are not illustrated in the figures. For example, the diffusion bond may have just two layers, for example a contact layer of titanium and a diffusions solder layer disposed directly on the titanium layer. Alternatively, the diffusion solder bond may consist of a contact layer, a noble metal layer disposed directly on the contact layer and a diffusion solder layer disposed on the noble metal layer.

As can be seen in the cross-sectional view of FIG. 4, a diffusion solder bond has the advantage that the lateral spreading of the solder layer 31 is significantly reduced over that which occurs in a soft solder bond since the thickness of the diffusion solder layer 20 is significantly smaller. In this embodiment of the invention, the diffusion solder layer as a thickness of approximately 2 µm. In contrast, soft solder is typically deposited on the die pad with a thickness of 50 to 100 µm.

Since the lateral spreading of the diffusion solder layer 31 is significantly less than that seen with soft solder, the distance between the two MOSFET devices 36 and 37 and the distance between the edges of the die pad and the two MOSFET devices 36, 37 can be reduced as the lateral spreading of excessive soft solder does not have to be accommodated. Consequently, MOSFET devices with larger lateral dimensions can be accommodated on the die pad by the use of the diffusion solder bond and the electrical performance of the electronic component can be improved.

In further assembly processes, the control semiconductor chip 38 is attached to the upper surface 14 of the first MOSFET device 36 by adhesive. The electrical connection of the MOSFET devices 36, 37 and the control semiconductor chip 38 to the leadframe 4 is carried out by means of wire-bonding.

The wire-bonding may be carried out in two or more processes. The wide bonds 40 and 44 extending between the MOSFET devices 36, 37 and the contact areas 9 of the leads 6 of the lead frame 4 typically include aluminium and have a diameter of around 250 µm. These bond wires may be formed in a first wire-bonding process.

The bond wires 42 and 43 which extend between the control semiconductor switch 38 and the MOSFET devices 36, 37 and the lead frame 4 typically include gold with a diameter of 75 µm. These bond connections can be formed in a second wire-bonding process.

The MOSFET devices 36, 37, the control semiconductor chip 38, the bond wires 40, 42, 43, 44, the inner portions 8 of the leads 6 of the lead frame 4, and the upper surface 19 of the die pad 5 are then encapsulated in epoxy resin 26 to form the plastic housing of the electronic component 35. The individual electronic component 35 are then singulated from the lead frame strip.

The electronic component 35 can then be used to control an electronic motor for example by mounting the component 35 on a printed circuit board along with further components to provide the desired circuit.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component comprising:
 at least two semiconductor components, each semiconductor component comprising an upper side and a lower side, wherein at least one semiconductor component is a vertical semiconductor power switch, the upper surface of the vertical semiconductor power switch comprising at least one electrode and the lower surface of the vertical semiconductor power switch comprising at least one electrode; and
 a circuit carrier comprising a die pad and a rewiring structure wherein the lower side of the at least two semiconductor components is attached to the die pad by a diffusion solder bond.

2. The electronic component according to claim 1, wherein the diffusion solder bond comprises an alloy, the alloy comprising Sn and one of a group consisting of Ag, Au, Cu and In.

3. The electronic component according to claim 1, wherein the diffusion solder bond comprises a contact layer disposed on the lower side of the semiconductor component, a diffusion baffler layer disposed on the contact layer, and a diffusion solder layer disposed on the diffusion barrier layer.

4. The electronic component according to claim 3, wherein the contact layer consists essentially of aluminium.

5. The electronic component according to claim 3, wherein the diffusion baffler layer comprises one of group of consisting of Ti metal and a first layer of consisting essentially of Ti metal and a second layer comprising $TiN_x$.

6. The electronic component according to claim 3, wherein the diffusion solder layer comprises an alloy, the alloy comprising Sn and one of a group consisting of Ag, Au, Cu and In.

7. The electronic component according to claim 1, wherein the diffusion solder bond comprises at least a contact layer and a diffusion solder layer, wherein the contact layer comprises one of a metal and an alloy thereof, the metal being one of the group of elements consisting of Ti, Ni and Cr, and wherein the diffusion solder layer comprises an alloy, the alloy comprising Sn and one of the group consisting of Ag, Au, Cu and In.

8. The electronic component according to claim 7, wherein the diffusion solder bond comprises at least one further layer, the at least one further layer being disposed between the contact layer and the diffusion solder layer and comprising one of a metal and an alloy thereof, the metal being one of the group of elements Ni, Au, Ag, Pt and Pd.

9. The electronic component according to claim 1, wherein the diffusion solder bond has a thickness t, where $0.1\ \mu m \leq t \leq 100\ \mu m$, preferably $0.1\ \mu m \leq t \leq 10\ \mu m$, more preferably $1.5\ \mu m \leq t \leq 3.5\ \mu m$.

10. The electronic component according to claim 1, wherein the diffusion solder bond has a thickness t, where $0.1\ \mu m \leq t \leq 100\ \mu m$.

11. The electronic component according to claim 3, wherein the diffusion solder bond has a thickness t where $0.1\ \mu m \leq t \leq 100\ \mu m$, preferably $0.1\ \mu m \leq t \leq 10\ \mu m$, more preferably $1.5\ \mu m \leq t \leq 3.5\ \mu m$ and wherein the contact layer has a thickness a, where $0.01\ \mu m \leq a \leq 10\ \mu m$, preferably $0.1\ \mu m \leq a \leq 1\ \mu m$, the diffusion barrier layer has a thickness b, where $0.1\ \mu m \leq b \leq 10\ \mu m$, preferably $0.1\ \mu m \leq b \leq 1\ \mu m$, and the diffusion solder layer has a thickness c, where $0.1\ \mu m \leq c \leq 80\ \mu m$, preferably $0.5\ \mu m \leq c \leq 5\ \mu m$.

12. The electronic component according to claim 3, wherein the diffusion solder bond has a thickness t where $0.1\ \mu m \leq t \leq 100\ \mu m$, and wherein the contact layer has a thickness a, where $0.01\ \mu m \leq a \leq 10\ \mu m$, the diffusion barrier layer has a thickness b, where 0.1 µm≦b≦10 µm, and the diffusion solder layer has a thickness c, where 0.1 µm≦c≦80 µm.

13. The electronic component according to claim 1, wherein the vertical semiconductor power switch is one of a MOSFET, a IGBT or a BJT.

14. The electronic component according to claim 1, wherein at least one semiconductor component is one of a PIN diode and a Schottky diode.

15. The electronic component according to claim 14, wherein the diode comprises SiC.

16. The electronic component according to claim 1, wherein the circuit carrier is a leadframe comprising a die pad and a plurality of leads, the plurality of leads providing the rewiring structure.

17. The electronic component according to claim 1, wherein the circuit carrier is a printed circuit board, the printed circuit board comprising a die pad and a rewiring structure, the rewiring structure comprising a plurality of inner contact pads, a plurality of conductor tracks and a plurality of outer contact pads.

18. The electronic component according to claim 1, wherein the circuit carrier comprises a ceramic substrate.

19. The electronic component according to claim 1, wherein the electronic component further comprises a plurality of bond wires.

20. The electronic component according to claim 1, wherein the electronic component further comprises a plastic housing, the plastic housing comprising an epoxy resin and encapsulating at least the semiconductor components.

21. An electronic component comprising:
   at least two semiconductor components, each semiconductor component comprising an upper side and a lower side, wherein at least one semiconductor component is a vertical semiconductor power switch, the upper surface of the vertical semiconductor power switch comprising at least one electrode and the lower surface of the vertical semiconductor power switch comprising at least one electrode; and
   a circuit carrier comprising a die pad and a rewiring structure wherein the lower side of the at least two semiconductor components is attached to the die pad by a diffusion solder bond, and
   wherein the electronic component comprises a diode and the vertical semiconductor power switch is one of a MOSFET or a IGBT.

22. The electronic component according to claim 21, wherein the electrode disposed on the lower surface of the diode is an anode and the electrode disposed on the lower surface of the MOSFET is a drain electrode.

23. The electronic component according to claim 21, wherein the electrode disposed on the lower surface of the diode is a cathode and the electrode disposed on the lower surface of the MOSFET is a drain electrode.

24. The electronic component according to claim 21, wherein the electrode disposed on the lower surface of the diode is an anode and the electrode disposed on the lower surface of the IGBT is an emitter electrode.

25. The electronic component according to claim 21, wherein the electrode disposed on the lower surface of the diode is a cathode and the electrode disposed on the lower surface of the IGBT is an emitter electrode.

26. The electronic component according to claim 21, wherein the diode is electrically connected in parallel with the semiconductor power switch.

27. An electronic component comprising:
   at least two semiconductor components, each semiconductor component comprising an upper side and a lower side, wherein at least one semiconductor component is a vertical semiconductor power switch, the upper surface of the vertical semiconductor power switch comprising at least one electrode and the lower surface of the vertical semiconductor power switch comprising at least one electrode; and
   a circuit carrier comprising a die pad and a rewiring structure wherein the lower side of the at least two semiconductor components is attached to the die pad by a diffusion solder bond, and
   wherein the electronic component comprises at least two vertical semiconductor power switches, wherein the semiconductor power switches are one of a MOSFET and a IGBT.

28. The electronic component according to claim 27, wherein the vertical semiconductor power switches are configured in pairs, each forming a half-bridge.

29. The electronic component according to claim 28, wherein, one of the vertical semiconductor power switches of each pair is an n-channel device and one of the vertical power switches of each pair is a p-channel device.

30. The electronic component according to claim 27, wherein the electronic component further comprises a control semiconductor die, wherein the control semiconductor die is mounted on the upper surface of the vertical semiconductor power switch by adhesive means.

31. The electronic component according to claim 27, wherein the electronic component further comprises a control semiconductor die, wherein the control semiconductor die is mounted on die pad by adhesive means.

* * * * *